(12) United States Patent
Kitamura et al.

(10) Patent No.: US 10,388,762 B2
(45) Date of Patent: Aug. 20, 2019

(54) METHOD OF MANUFACTURING SEMICONDUCTOR DEVICE

(71) Applicant: HITACHI KOKUSAI ELECTRIC INC., Tokyo (JP)

(72) Inventors: Masahito Kitamura, Toyama (JP); Hiroshi Ashihara, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 15/613,807

(22) Filed: Jun. 5, 2017

(65) Prior Publication Data

US 2017/0352745 A1   Dec. 7, 2017

(30) Foreign Application Priority Data

Jun. 6, 2016   (JP) ................................ 2016-112732

(51) Int. Cl.
*C23C 8/08* (2006.01)
*C23C 8/80* (2006.01)
(Continued)

(52) U.S. Cl.
CPC .......... *H01L 29/66795* (2013.01); *C23C 8/08* (2013.01); *C23C 8/80* (2013.01);
(Continued)

(58) Field of Classification Search
CPC ............. H01L 51/5024; H01L 51/5064; H01L 29/66795; H01L 21/2254
See application file for complete search history.

(56) References Cited

U.S. PATENT DOCUMENTS 3,115,393 A   12/1963   Robb
5,183,777 A   2/1993   Doki et al.
(Continued)

FOREIGN PATENT DOCUMENTS

JP   02-132823 A   5/1990
JP   04-057319 A   2/1992
(Continued)

OTHER PUBLICATIONS

Korean Office Action dated Apr. 27, 2018 for the Korean Patent Application No. 10-2017-0068180.
(Continued)

*Primary Examiner* — Zandra V Smith
*Assistant Examiner* — Andre C Stevenson
(74) *Attorney, Agent, or Firm* — Volpe and Koenig, P.C.

(57) ABSTRACT

Described is a technique for uniformly doping a silicon substrate having a Fin structure with a dopant. A method of manufacturing a semiconductor device may includes: (a) forming a dopant-containing film containing a dopant on a silicon film by performing a cycle a predetermined number of times, the cycle including: (a-1) forming a first dopant-containing film by supplying a first dopant-containing gas containing the dopant and a first ligand to a substrate having thereon the silicon film and one of a silicon oxide film and a silicon nitride film; and (a-2) forming a second dopant-containing film by supplying a second dopant-containing gas containing the dopant and a second ligand different from and reactive with the first ligand to the substrate; and (b) forming a doped silicon film by annealing the substrate having the dopant-containing film thereon to diffuse the dopant into the silicon film.

8 Claims, 7 Drawing Sheets

(51) Int. Cl.
*H01L 29/66* (2006.01)
*H01L 21/225* (2006.01)
*H01L 21/324* (2006.01)
*H01L 29/167* (2006.01)

(52) U.S. Cl.
CPC ........ *H01L 21/2254* (2013.01); *H01L 21/324* (2013.01); *H01L 29/167* (2013.01); *H01L 29/66803* (2013.01)

(56) References Cited

U.S. PATENT DOCUMENTS

| | | | |
|---|---|---|---|
| 6,555,451 B1 | 4/2003 | Kub et al. | |
| 7,232,631 B2 | 6/2007 | Morimoto et al. | |
| 8,012,859 B1* | 9/2011 | Joe | C23C 16/0227 438/478 |
| 2004/0005788 A1* | 1/2004 | Gonzalez | H01L 21/3211 438/776 |
| 2009/0277385 A1 | 11/2009 | Mizuno et al. | |
| 2012/0252197 A1 | 10/2012 | Clark | |
| 2014/0295648 A1 | 10/2014 | Nakaiso et al. | |

FOREIGN PATENT DOCUMENTS

| | | |
|---|---|---|
| JP | 08-330246 A | 12/1996 |
| JP | 2009-272558 A | 11/2009 |
| JP | 2013-524516 A | 6/2013 |
| JP | 2013-197307 A | 9/2013 |
| JP | 2014-513416 A | 5/2014 |
| KR | 20130069608 A | 6/2013 |
| KR | 20140118711 A | 10/2014 |

OTHER PUBLICATIONS

Japanese Office Action dated Apr. 23, 2019 for the Japanese Patent Application No. 2016-112732.

* cited by examiner

METHOD OF MANUFACTURING SEMICONDUCTOR DEVICE

CROSS-REFERENCE TO RELATED PATENT APPLICATION

This non-provisional U.S. patent application claims priority under 35 U.S.C. § 119 of Japanese Patent Application No. 2016-112732, filed on Jun. 6, 2016, the entire contents of which are hereby incorporated by reference.

BACKGROUND

1. Field

The present disclosure relates to a method of manufacturing semiconductor device.

2. Description of the Related Art

A planar transistor, which is a two-dimensional structure with a transistor formed on a silicon substrate, is manufactured in a conventional LSI manufacturing process. Although the miniaturization of the planar transistor has limits due the short channel effects thereof, the LSI manufacturing process further requires miniaturizations.

In order to manufacture a FinFET structure or a Fin structure, which is a recently developed three-dimensional structure, a technique of uniformly doping impurity on upper surface and side surfaces of the fin is required. Since typical crystalline silicon (Si) is a completely crystalline without any impurities, the crystalline silicon has insulating properties. However, when silicon is doped with impurity (dopant), the silicon doped with impurity is conductive since the impurity acts as a carrier. On the other hand, since the ion of the dopant tends to move straight, it is difficult to uniformly dope the surface of the fin structure.

SUMMARY

Described herein is a technique for uniformly doping a silicon substrate having a Fin structure with a dopant.

According to one aspect of the technique described herein, a method of manufacturing a semiconductor device may includes: (a) forming a dopant-containing film containing a dopant on a silicon film by performing a cycle a predetermined number of times, the cycle including; (a-1) forming a first dopant-containing film by supplying a first dopant-containing gas containing the dopant and a first ligand to a substrate having thereon the silicon film and one of a silicon oxide film and a silicon nitride film; and (a-2) forming a second dopant-containing film by supplying a second dopant-containing gas containing the dopant and a second ligand different from and reactive with the first ligand to the substrate; and (b) forming a doped silicon film by annealing the substrate having the dopant-containing film thereon to diffuse the dopant into the silicon film.

DETAILED DESCRIPTION

Hereinafter, an embodiment will be described with reference to FIG. 1 through FIG. 3.

(1) CONFIGURATION OF A SUBSTRATE PROCESSING APPARATUS

Figure 1:
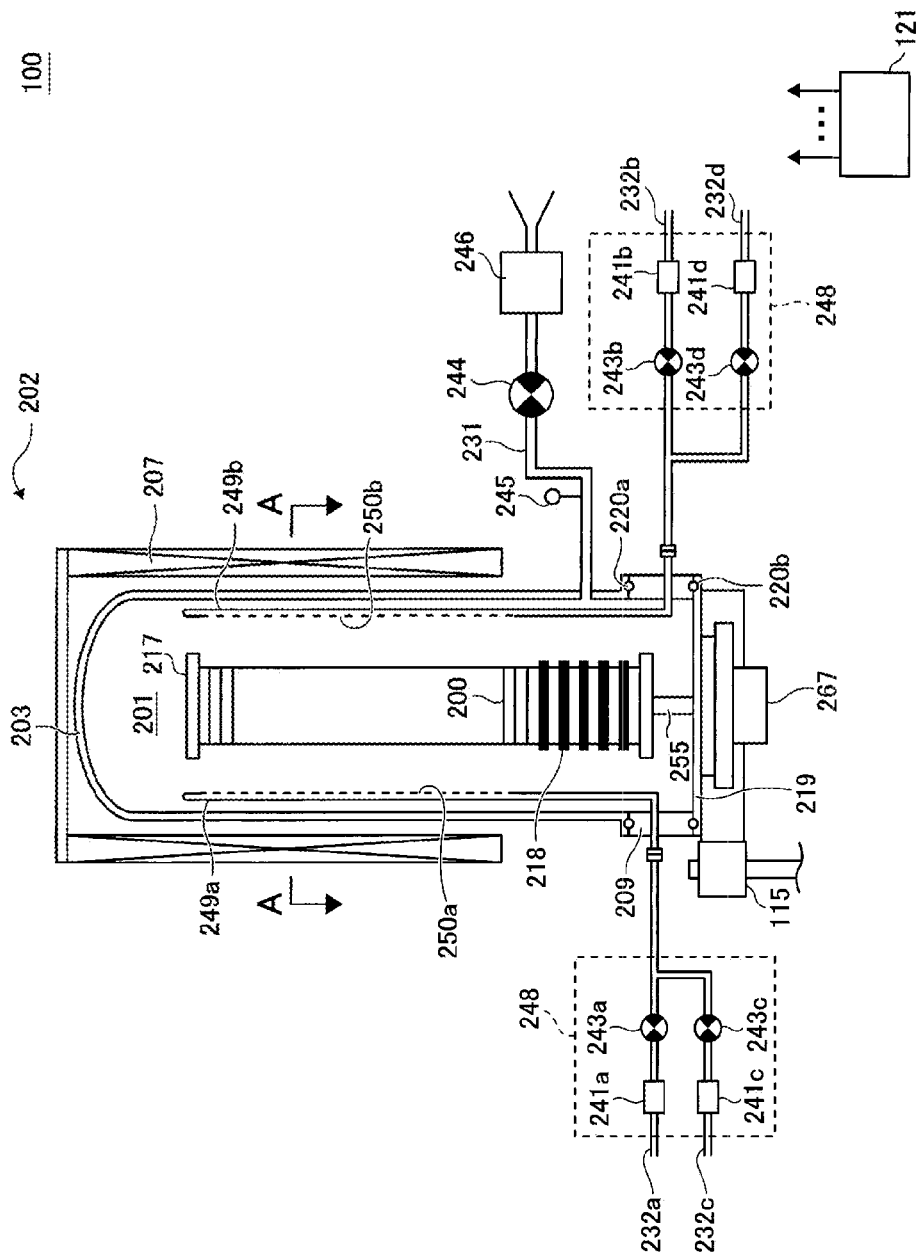
FIG. 1 schematically illustrates a configuration of a vertical type processing furnace of a substrate processing apparatus preferably used in an embodiment described herein.

As illustrated in FIG. 1, a process furnace 202 includes a heater 207 serving as a heating system (temperature adjusting unit). The heater 207 is cylindrical, and vertically installed while being supported by a support plate (not shown). The heater 207 also functions as an activation mechanism (excitation unit) for activating (exciting) a gas into heat.

A reaction tube 203 is installed in the heater 207 so as to be concentric with the heater 207. The reaction tube 203 is made of a heat-resistant material such as quartz ($SiO_2$) and silicon carbide (SiC), and cylindrical with a closed upper end and an open lower end. A manifold 209 is installed under the reaction tube 203 so as to be concentric with the reaction tube 203. The manifold 209 is made of a metal such as stainless steel (SUS), and cylindrical with open upper and lower ends. The upper end of the manifold 209 is engaged with the lower end of the reaction tube 203 so as to support the reaction tube 203. An O-ring 220a serving as a sealing member is installed between the manifold 209 and the reaction tube 203. The reaction tube 203 is vertically installed like the heater 207. A processing vessel (reaction vessel) is constituted by the reaction tube 203 and the manifold 209. A process chamber 201 is installed in the hollow cylindrical portion of the processing vessel. The process chamber 201 may house a plurality of wafers 200 as substrates.

Nozzles 249a and 249b are installed in the process chamber 201 through sidewalls of the manifold 209. Gas supply pipes 232a and 232b are connected to the nozzles 249a and 249b, respectively.

MFCs (Mass Flow Controllers) 241a and 241b serving as flow rate controllers (flow rate control units) and valves 243a and 243b serving as opening/closing valves are sequentially installed at the gas supply pipes 232a and 232b, respectively, from the upstream side to the downstream side of the gas supply pipes 232a and 232b. Gas supply pipes 232c and 232d configured to supply an inert gas are connected to the gas supply pipes 232a and 232b at the downstream sides of the valves 243a and 243c, respectively.

MFCs 241c and 241d and valves 243c and 243d are sequentially installed at the gas supply pipes 232c and 232d, respectively from the upstream side to the downstream side of the gas supply pipes 232c and 232d.

Figure 2:
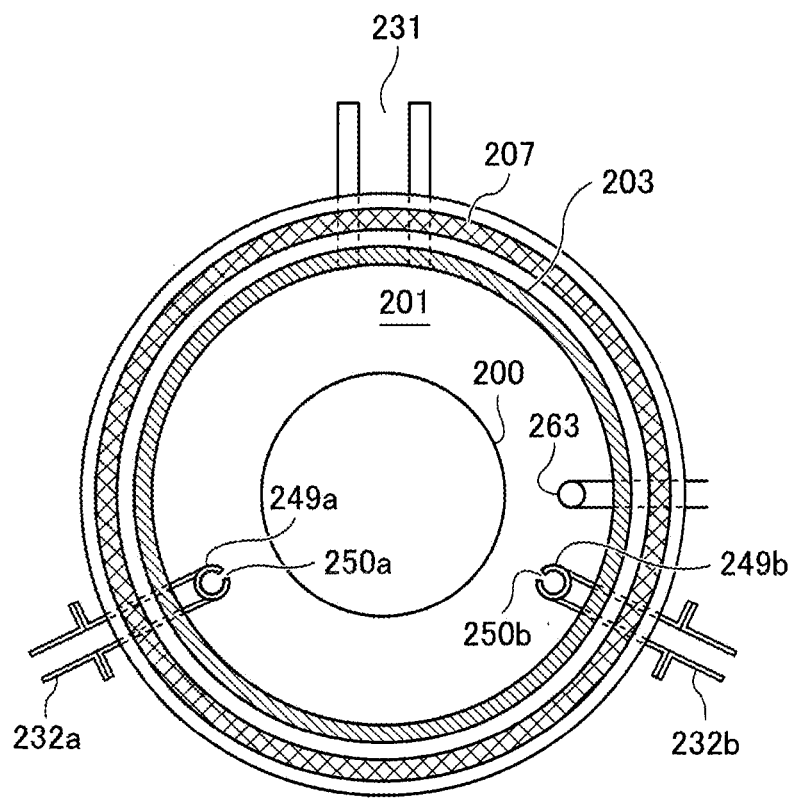
FIG. 2 schematically illustrates a cross section taken along the line A-A of the vertical type processing furnace of the substrate processing apparatus shown in FIG. 1.

As illustrated in FIG. 2, the nozzles 249a and 249b are installed in a space between the inner wall of the reaction tube 203 and wafers 200 so as to extend from bottom to top of the inner wall of the reaction tube 203 along the stacking direction of the wafers 200, the space having an annular shape when seen from the top. A plurality of gas supply holes 250a and a plurality of gas supply holes 250b are disposed at the side surfaces of the nozzles 249a and 249b, respectively. The plurality of gas supply holes 250a and 250b may be open toward the center of the reaction tube 203, and configured to supply a gas toward the wafer 200. The plurality of gas supply holes 250a and 250b are disposed across the reaction tube 203 from bottom to top thereof.

A first dopant-containing gas containing: boron (B) as a dopant element; and a halogen element such as chlorine (Cl) as an element constituting a first ligand is supplied to the process chamber 201 through gas supply pipe 232a provided with the MFC 241a and the valve 243a and the nozzle 249a. For example, boron trichloride ($BCl_3$) gas containing boron and chlorine may be used as the first dopant-containing gas.

A second dopant-containing gas containing: boron (B) as a dopant element; and a hydrogen (H) as an element constituting a second ligand is supplied to the process chamber 201 through gas supply pipe 232b provided with the MFC 241a and the valve 243b and the nozzle 249b. For example, diborane($B_2H_6$) gas containing boron and hydrogen may be used as the second dopant-containing gas.

The inert gas, such as nitrogen ($N_2$) gas, is supplied into the process chamber 201 via the gas supply pipes 232c and 232d provided with the MFCs 241c and 241d and the valves 243c and 243d, the gas supply pipes 232a and 232b and the nozzles 249a and 249b.

The first dopant-containing gas supply system includes the gas supply pipe 232a, the MFC 241a and the valve 243a. The second dopant-containing gas supply system includes the gas supply pipe 232b, the MFC 241b the valve 243b. The first dopant-containing gas supply system and the second dopant-containing gas supply system are collectively referred to as a "gas supply system". The inert gas supply system includes the gas supply pipes 232c and 232d, the MFCs 241c and 241d, and the valves 243c and 243d. The gas supply system may further include the inert gas supply system.

Any one of or all of the above-described supply systems may be embodied as an integrated gas supply system 248 in which the components such as the valves 243a through 243d or the MFCs 241a through 241d are integrated. The integrated gas supply system 248 is connected to the respective gas supply pipes 232a through 232d. An operation of the integrated gas supply system 248 to supply various gases to the gas supply pipes 232a through 232d, for example, operations such as an operation of opening/closing the valves 243a through 243d and an operation of adjusting a flow rate through the MFCs 241a through 241d may be controlled by a controller 121 described later. The integrated gas supply system 248 may be embodied as an integrated unit having an all-in-one or divided structure. The components of the integrated gas supply system 248, such as the gas supply pipes 232a through 232d, can be attached/detached on a basis of the integrated unit. Operations such as maintenance, exchange and addition of the integrated gas supply system 248 may be performed on a basis of the integrated unit.

The exhaust pipe 231 for exhausting the inner atmosphere of the process chamber 201 is installed at the reaction tube 203. A vacuum pump 246 serving as a vacuum exhauster is connected to the exhaust pipe 231 through a pressure sensor 245 and an APC (Automatic Pressure Controller) valve 244. The pressure sensor 245 serves as, a pressure detector (pressure detection unit) to detect the inner pressure of the process chamber 201, and the APC valve 244 serves as a pressure controller (pressure control unit). With the vacuum pump 246 in operation, the APC valve 244 may be opened/closed to vacuum-exhaust the process chamber 201 or stop the vacuum exhaust. With the vacuum pump 246 in operation, the opening degree of the APC valve 244 may be adjusted based on the pressure detected by the pressure sensor 245, in order to control the inner pressure of the process chamber 201. An exhaust system includes the exhaust pipe 231, the APC valve 244 and the pressure sensor 245. The exhaust system may further include the vacuum pump 246.

A seal cap 219 serving as a furnace opening cover can airtightly seal the lower end opening of the manifold 209, and is installed under the manifold 209. The seal cap 219 is made of metal such as SUS, and formed in a disk shape. The O-ring 220b serving as a sealing, member is installed on the upper surface of the seal cap 219 so as to be in contact with the lower end of the manifold 209. A rotating mechanism 267 to rotate a boat 217 described later is installed under the seal cap 219. The rotating mechanism 267 includes a rotating shaft 255 connected to the boat 217 through the seal cap 219. As the rotating mechanism 267 rotates the boat 217, the wafer 200 is rotated. The seal cap 219 may be moved upward/downward in the vertical direction by a boat elevator 115 installed outside the reaction tube 203 and serving as an elevating mechanism. When the seal cap 219 is moved upward/downward by the boat elevator 115, the boat 217 may be loaded into the process chamber 201 or unloaded out of the process chamber 201. The boat elevator 115 serves as a transfer device (transfer mechanism) that loads the boat 217, that is, the wafer 200 into the process chamber 201 or unloads the boat 217, that is, the wafer 200 out of the process chamber 201.

The boat 217 serving as a substrate support aligns a plurality of wafers 200, for example, 25 to 200 wafers 200 in the vertical direction and supports the plurality of wafers 200, while the wafers 200 are horizontally positioned and centered with each other. The boat 217 is made of a heat-resistant material such as quartz and SiC. An insulating plate 218 is made of a heat-resistant material such as quartz and SiC, and installed in multi-stages under the boat 217.

A temperature sensor 263 serving as a temperature detector is installed in the reaction tube 203. The state of electricity conducted to the heater 207 is adjusted based on the temperature detected by the temperature sensor 263, such that the internal temperature of the process chamber 201 has a desired temperature distribution. The temperature sensor 263 is L-shaped like the nozzles 249a and 249b, and installed along the inner wall of the reaction tube 203.

Figure 3:
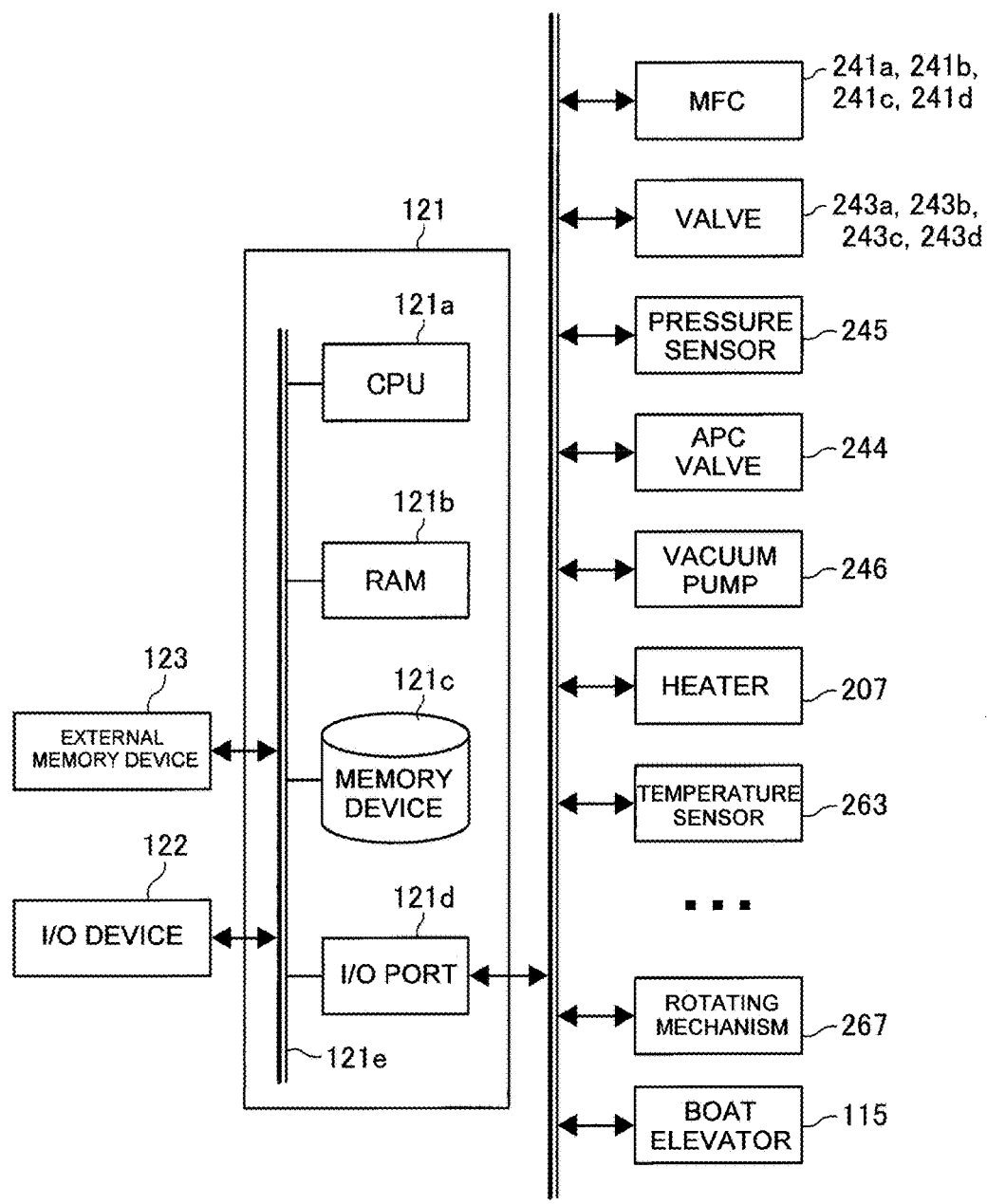
FIG. 3 is a block diagram schematically illustrating a configuration of a controller and components controlled by the controller of the substrate processing apparatus according to the embodiment.

As shown in FIG. 3, the controller 121 serving as a control unit is embodied by a computer including a CPU (Central Processing Unit) 121a, a RAM (Random Access Memory) 121b, a memory device 121c and an I/O port 121d. The RAM 121b, the memory device 121c and the I/O port 121d may exchange data with the CPU 121a through an internal bus 121e. For example, an I/O device 122 such as a touch panel is connected to the controller 121.

The memory device 121c is embodied by components such as a flash memory and HDD (Hard Disk Drive). A control program for controlling the operation of the substrate processing apparatus or a process recipe containing information on the sequence and conditions of a film forming process described later is readably stored in the memory device 121c. The process recipe is obtained by combining steps of the film forming process described later such that the controller 121 can execute the steps to acquire a predetermine result, and functions as a program. Hereafter, the process recipe and the control program are collectively referred to as a program. The process recipe is simply referred to as a recipe. In this specification, "program" may indicate only the recipe, indicate only the control program, or indicate both of them. The RAM 121b is a work area where a program or data read by the CPU 121a is temporarily stored.

The I/O port 121d is connected to the above-described components such as the MFCs 241a through 241d, the valves 243a through 243d, the pressure sensor 245, the APC valve 244, the vacuum pump 246, the temperature sensor 263, the heater 207, the rotating mechanism 267, the boat elevator 115 and the shutter opening/closing, mechanism 115s.

The CPU 121a is configured to read a control program from the memory device 121c and execute the read control program. Furthermore, the CPU 121a is configured to read a recipe from the memory device 121c according to an operation command inputted from the I/O device 122. According to the contents of the read recipe, the CPU 121a may be configured to control various operations such as flow rate adjusting operations for various gases by the MFCs 241a through 241d, opening/closing operations of the valves 243a through 243d, an opening/closing operation of the APC valve 244, a pressure adjusting operation by the APC valve 244 based on the pressure sensor 245, a start and stop of the vacuum pump 246, a temperature adjusting operation of the heater 207 based on the temperature sensor 263, a rotation operation and rotation speed adjusting operation of the boat 217 by the rotating mechanism 267, and an elevating operation of the boat 217 by the boat elevator 115.

The controller 121 may be embodied by installing the above-described program stored in an external memory device 123 into a computer, the external memory device 123 including a magnetic disk such as a hard disk, an optical disk such as CD and DVD, a magneto-optical disk such as MO, and a semiconductor memory such as a USB memory. The memory device 121c or the external memory device 123 may be embodied by a transitory computer readable recording medium. Hereafter, the memory device 121c and the external memory device 123 are collectively referred to as recording media. In this specification, "recording media" may indicate only the memory device 121c, indicate only the external memory device 123, and indicate both of the memory device 121c and the external memory device 123. In addition to the external memory device 123, a communication unit such as the Internet and dedicated line may be used as the unit for providing a program to a computer.

(2) SUBSTRATE PROCESSING

An exemplary sequence of forming a film on a substrate, which is a substrate processing for manufacturing a semiconductor device such an IC, using the substrate processing apparatus 100 will be described with reference to FIG. 4. Herein, the components of the substrate processing apparatus 100 are controlled by the controller 121.

In this specification, "wafer" may refer to "a wafer itself" or refer to "a wafer and a stacked structure (aggregated structure) of predetermined layers or films formed on the surface of the wafer". That is, the wafer and the predetermined layers or films formed on the surface of the water may be collectively referred to as the wafer. In this specification, "surface of wafer" refers to "a surface (exposed surface) of a wafer" or "the surface of a predetermined layer or film formed on the wafer, i.e, the top surface of the wafer as a stacked structure".

Thus, in this specification, "forming a predetermined layer (or film) on a wafer" may refer to "forming a predetermined layer (or film) on a surface of wafer itself" or refer to "forming a predetermined layer (or film) on a surface of a layer or film formed on the wafer", i.e. "forming a predetermined layer (or film) on a top surface of a stacked structure". In this specification, "substrate" and "wafer" may be used as substantially the same meaning.

<Wafer Loading Step>

After the boat 217 is charged with wafers 200 having a silicon film and a silicon oxide film formed thereon, the boat 217 is lifted by the boat elevator 115 and loaded into the process chamber 201 (boat loading). With the boat 217 loaded, the seal cap 219 seals the lower end of the manifold 209 through the O-ring 220.

<Pressure and Temperature Adjusting Step>

The vacuum pump 246 vacuum-exhausts the process chamber 201 such that the inner pressure of the process chamber 201, that is, the pressure of the space in which the wafers 200 are present is set to a desired pressure (vacuum degree). At this time, the inner pressure of the process chamber 201 is measured by the pressure sensor 245, and the APC valve 244 is feedback controlled based on the measured pressure. The vacuum pump 246 is continuously operated until at least the process for the wafers 200 is ended. The heater 207 heats the process chamber 201 such that the temperature of the wafer 200 in the process chamber 201 becomes a desired film forming temperature. The state of electricity conducted to the heater 207 is feedback controlled based on the temperature detected by the temperature sensor 263, such that the internal temperature of the process chamber 201 has a desired temperature distribution. The heater 207 continuously heats the process chamber 201 until at least the process for the wafers 200 is ended. The rotating mechanism 267 starts to rotate the boat 217 and the wafer 200. Until at least the process for the wafers 200 is ended, the rotating mechanism 267 continuously rotates the boat 217 and the wafer 200.

<Film-Forming Step>

Next, the first step through the fourth step is performed sequentially.

[First Step]

In the first step, $BCl_3$ gas is supplied onto the wafer 200 in the process chamber 201 and then exhausted. Specifically, the valve 243a is opened to supply $BCl_3$ gas into the gas supply pipe 232a. After the flow rate of $BCl_3$ gas is adjusted by the MFC 241a, the $BCl_3$ gas is supplied into the process chamber 201 through the nozzle 249a, and exhausted through the exhaust pipe 231. Simultaneously, the valve 243c is opened, to supply $N_2$ gas into the gas supply pipe 232c. After the flow rate of $N_2$ gas is adjusted by the MFC 241d, the $N_2$ gas is supplied with the $BCl_3$ gas into the process chamber 201, and exhausted through the exhaust pipe 231. In order to prevent the $BCl_3$ gas from entering the nozzle 249b, the valve 243d is opened to supply $N_2$ gas into the gas supply pipe 232d. The $N_2$ gas is supplied into the process chamber 201 through the gas supply pipe 232d and the nozzle 249b, and exhausted through the exhaust pipe 231.

For example, the inner pressure (film-forming pressure) of the process chamber 201 ranges from 10 Pa to 500 Pa, preferably from 10 Pa to 300 Pa, more preferably from 10 Pa to 100 Pa. When the film-forming pressure is less than 10 Pa, the $BCl_3$ gas may be exhausted from the process chamber 201 without participating in a chemical reaction due to an increase in the flow velocity thereof. Herein, "from 10 Pa to 500 Pa" refers to "10 Pa or higher and 500 Pa or lower". The same also applies to other numerical ranges. When the film-forming pressure exceeds 500 Pa, the $BCl_3$ gas is pyrolyzed and the boron is agglomerated, which may result in the generation of particles. For example, the flow rate of the $BCl_3$ gas ranges from 10 sccm to 2000 sccm. For example, the time duration of the $BCl_3$ gas supply ranges from 1 second to 10 seconds. For example, the flow rate of $N_2$ gas supplied through each gas supply pipe ranges from 100 sccm to 5000 sccm. For example, the temperature (film-forming temperature) of the wafer 200 ranges from 150° C. to 250° C., preferably from 200° C. to 250° C.

By supplying the $BCl_3$ gas to the wafer 200 under the above-described conditions, a boron-containing layer (first layer, $BCl_3$ layer) containing boron and chlorine is selectively formed on the exposed portion of the silicon film on the wafer 200.

[Second Step]

After the first step is completed, the residual gas in the process chamber 201 is removed.

Specifically, after the first layer is formed in the first step, the valve 243a is closed to stop the supply of the $BCl_3$ gas. With the ARC valve 244 open, the vacuum pump 246 vacuum-exhausts the interior of the process chamber 201 to remove residual $BCl_3$ gas or reaction byproducts which did not react or contributed to the formation of the first layer from the process chamber 201. By maintaining the valves 243c and 243d open, $N_2$ gas is continuously supplied into the process chamber 201. $N_2$ gas acts as a purge gas.

[Third Step]

After the second step is completed, the $B_2H_6$ gas is supplied onto the water 200 in the process chamber 201. Specifically, the valve 243a is closed and the valve 243b is opened to supply the $B_2H_6$ gas into the gas supply pipe 232b. The opening and closing control of the valves 243c and 243d is the same as those of the first step. After the flow rate of the $B_2H_6$ gas is adjusted by the MFC 241b, the $B_2H_6$ gas is supplied into the process chamber 201 via the nozzle 249b, and then exhausted through the exhaust pipe 231. After the flow rate of the $N_2$ gas is adjusted by the MFC 241d, the $N_2$ gas is then supplied into the process chamber 201 along with the $B_2H_6$ gas, and then exhausted through the exhaust pipe 231.

For example, the inner pressure (film-forming pressure) of the process chamber 201 ranges from 10 Pa to 500 Pa. When the film-forming pressure is less than 10 Pa, the $B_2H_6$ gas may be exhausted from the process chamber 201 without participating in a chemical reaction due to an increase in the flow velocity thereof. When the film-forming pressure exceeds 500 Pa, the $B_2H_6$ gas is pyrolyzed and the boron is agglomerated, which may result in the generation of particles. For example, the flow rate of the $B_2H_6$ gas ranges from 10 sccm to 2000 sccm. For example, the time duration of the $B_2H_6$ gas supply ranges from 1 second to 10 seconds. For example, the flow rate of $N_2$ gas supplied through each gas supply pipe ranges from 100 sccm to 5000 sccm. For example, the temperature (film-forming temperature) range of the wafer 200 is same as that of the first step. When the film-forming temperature is less than 150° C., the $B_2H_6$ gas is not adsorbed, which may result in a failure to form, the second layer. When the film-forming temperature exceeds 250° C., is pyrolyzed and the boron is agglomerated, which may result in the generation of particles.

The $B_2H_6$ gas supplied to the wafer 200 reacts with at least a portion of the first layer formed in the first step on the exposed portion of the silicon film on the wafer 200. That is, the chlorine in the first layer which was the ligand of the $BCl_3$ gas, and hydrogen which is the ligand of the $B_2H_6$ gas, react with each other to generate HCl which desorbs from the first layer. The second layer, which is a boron layer with low impurity concentration, is (selectively grown) formed on the silicon film by the bonding between the boron in the $B_2H_6$ gas and the first layer.

[Fourth Step]

After the second step is completed, the residual gas in the process chamber 201 is removed. Specifically, after the second layer is formed in the second step, the valve 243b is closed to stop the supply of the $B_2H_6$ gas. With the APC valve 244 open, the vacuum pump 246 vacuum-exhausts the interior of the process chamber 201 to remove residual $B_2H_6$ gas or reaction byproducts which did not react or contributed to the formation of the second layer from the process chamber 201. By maintaining the valves 243c and 243d open, $N_2$ gas is continuously supplied into the process chamber 201. $N_2$ gas acts as a purge gas.

[Repeating Step]

A dopant-containing film (boron film) containing boron having a predetermined composition and a predetermined thickness is formed on the wafer 200 by performing a cycle including the first step through the fourth step a predetermined number of times (n times, n is an integer equal to or greater than 1). When n=1, the second layer, which is a boron layer formed in the fourth step, is the dopant-containing film.

The thickness of the boron film is about 1 Å, and preferably about one atomic layer. When the thickness of the boron film is greater than 1 Å, the boron film may obstruct subsequent steps from being performed normally. Therefore, it is preferable that the boron film is formed to have only a necessary thickness, and diffuse boron in a subsequent process. Preferably, the above cycle is performed once (n=1).

When two different, source gases, having two different ligands reactive with each other are alternately supplied, by-products are produced from the reaction between the two ligands. Since the by-products are removed from the boron film, it is possible to form the boron films with low concentration of impurities such as chlorine and hydrogen. That is, since the chlorine contained in the first layer formed on the wafer 200 and the hydrogen contained in the $B_2H_6$ gas react with each other to generate by-product hydrogen chloride (HCl), the chlorine in the film is thereby removed. Therefore, only the boron from the $B_2H_6$ gas remains in the film.

Since the chemical reaction is not derived from a thermal decomposition of the source gases, the boron film may be primarily and selectively formed only on the silicon film of the silicon film and the silicon oxide film present on the surface of the wafer 200. That is, the selectivity to the silicon film is very high. Since crystallized boron is chemically inert and acid resistant and rarely bonds with oxygen (O), the boron film is hardly formed on the silicon oxide film.

After a boron film having the predetermined thickness is formed, a silicon oxide film or to SiN film may be formed as a capping film on the boron film. The capping film suppresses the volatilization of boron in the subsequent annealing step.

<Annealing Step>

Next, an annealing is performed under high pressure $N_2$ atmosphere at high temperature. Specifically, the valves 243c and 243d are opened to continuously supply $N_2$ gas into the process chamber 201 while maintaining the inside of the process chamber 201 at high temperature and at high pressure to diffuse the boron in the wafer 200 into the silicon film, thereby doping the silicon film.

For example, the inner pressure of the process chamber 201 ranges from 10 Pa to 100000 Pa, and the inner temperature of the process chamber 201 ranges from 900° C. to 1200° C. preferably from 1000° C. to 1200° C. The time duration of the annealing ranges from 60 to 3600 seconds, preferably from 60 to 600 seconds. The flow rate of supplied $N_2$ gas ranges from 100 sccm to 10000 sccm.

When the inner temperature is less than 900° C. or the time duration of the annealing is less than 60 seconds, the boron may not diffuse into the silicon film. When the inner temperature exceeds 1200° C. or the time duration of the annealing exceeds 3600 seconds, the silicon film may melt or the boron may sublimate. When the annealing step is performed at a temperature ranging from 900° C. to 1200° C. (preferably 1000° C. to 1200° C.) for a time duration ranging from 60 seconds to 3600 seconds (preferably 60 seconds to 600 seconds), the silicon atoms in the wafer 200 become more active to move to form single crystal. As a result, boron diffuses into the silicon film to more efficiently form the doped silicon film.

That is, by diffusing boron into the silicon film after uniformly forming the silicon film on the wafer 200, the silicon film may be uniformly doped with boron. Even when impurities such as chlorine and hydrogen remain in the boron film, the impurity may be removed as HCl in the annealing step.

When boron is used as a dopant element and the annealing step is performed ex-situ, the boron film may be oxidized into a boron oxide film. As a result, the silicon film may be converted to a doped silicon oxide film in the annealing step. Therefore, it is preferable that the annealing step is performed in-situ in the process chamber 201 after the film-forming process in order to prevent oxidation of the boron film. However, when the capping film is formed on the boron film as described above, the oxidation may be suppressed by the capping film. The annealing step may be performed ex-situ when the oxidation can be suppressed.

<Purging and Returning to Atmospheric Pressure Step>

After the annealing step is performed, $N_2$ gas is supplied into the process chamber 201 through each of the gas supply pipes 232c and 232d and then exhausted through the exhaust pipe 231. The $N_2$ gas acts as a purge gas. The process chamber 201 is thereby purged such that the gas or the reaction by-products remaining in the process chamber 201 are removed from the process chamber 201. Thereafter, the inner atmosphere of the process chamber 201 is replaced with an inert gas, and the inner pressure of the process chamber 201 is returned to atmospheric pressure.

<Boat Unloading and Wafer Discharging>

The seal cap 219 is lowered by the boat elevator 115 and the lower end of the manifold 209 is opened. The boat 217 with the processed wafer 200 charged therein is unloaded from the reaction tube 203 through the lower end of the manifold 209. The processed wafer 200 is discharged from the boat 217.

(3) EFFECT

The embodiment described above provides one or more advantageous effects described below.

(a) The boron film according to the embodiment is formed by alternately supplying two different source gases having two different ligands reactive with each other, and removing by-products produced from the reaction between the two ligands. As a result, the boron films with low concentration of impurities and superior step coverage may be formed.

(b) Since the chemical reaction is not derived from a thermal decomposition of the source gases, the selectivity is superior. That is, the boron film may be primarily and selectively formed only on the silicon film of the silicon film and the silicon oxide film (or SiN film) present on the surface of the wafer 200.

(c) By forming a capping layer such as silicon oxide film and SiN film after the formation of the boron film and before the annealing, the volatilization of boron in the subsequent annealing step.

(d) By performing the annealing after forming the boron film on the silicon film, the boron in the boron film is diffused into the silicon film. As a result, the doped silicon film with superior step coverage may be formed.

(e) Since residual source gases are removed in each of the second step and the fourth step, the deposition rate is reduced, which facilitates the formation of a thin film.

(f) Even when the surface of the wafer 200 is hydrogen (H) terminated, the BCl3 gas, which is supplied before the $B_2H_6$ gas, reacts with hydrogen on the wafer 200 to be adsorbed to the wafer 200.

(4) MODIFIED EXAMPLES

Figure 4:
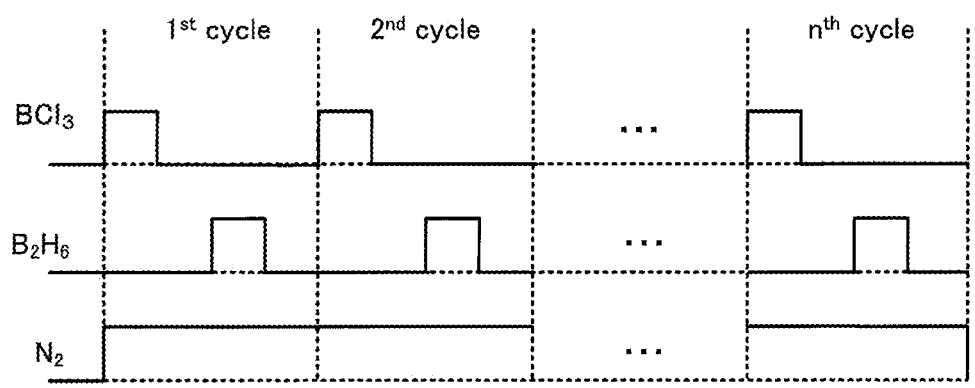
FIG. 4 is a timing diagram of a gas supply according to the embodiment.

The sequence of the film-forming process according to the embodiment is not limited to the one shown in FIG. 4. The embodiment may be modified as described below.

First Modified Example

Figure 5:
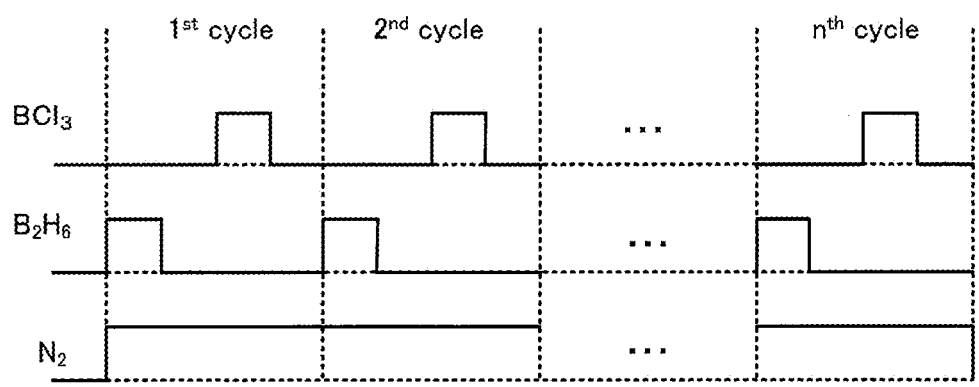
FIG. 5 illustrates a first modified example of the timing diagram of the gas supply according to the embodiment.

As shown in FIG. 5, a cycle including: a first step for supplying $B_2H_6$ gas; a second step for removing a residual gas; a third step for supplying $BCl_3$ gas; and a fourth step for removing a residual as may be performed a predetermined number of times (n times).

The first modified example provides advantageous effects that are the same as the advantageous effects (a) through (e) described above of the film-forming sequence shown in FIG. 4.

Second Modified Example

Figure 6:
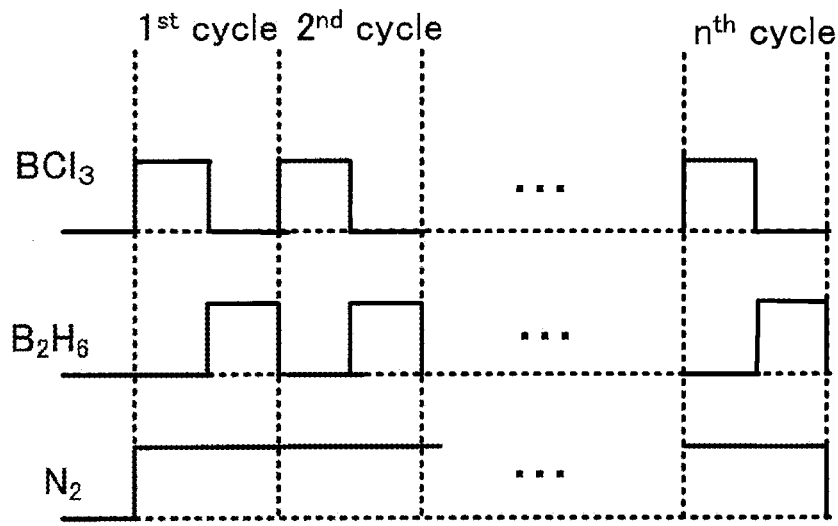
FIG. 6 illustrates a second modified example of the timing diagram of the gas supply according to the embodiment.

As shown in FIG. 6, a cycle including: first step for supplying $BCl_3$ gas; and a second step for supplying $B_2H_6$ gas may be performed a predetermined number of times (n times). The second modified example differs from the embodiment in that the residual gases are not removed after each of the source gas supply steps.

The second modified example provides advantageous effects that are the same as the advantageous effects (a) through (d) and (f) described above of the film-forming sequence shown in FIG. 4. The deposition rate is increased the amount of chemical reaction is increased due to the lack of the residual gas removing steps.

Third Modified Example

Figure 7:
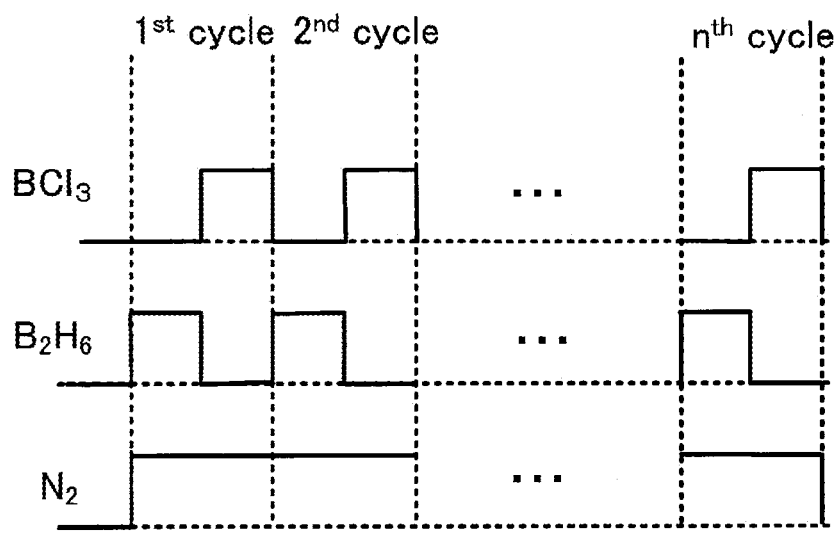
FIG. 7 illustrates a third modified example of the timing diagram of the gas supply according to the embodiment.

As shown in FIG. 7, a cycle including: a first step for supplying $B_2H_6$ gas; and a second step for supplying $BCl_3$ gas may be performed a predetermined number of times (n times). Similar to the second modified example, the third modified example differs from the embodiment in that the residual gases are not removed after each of the source gas supply steps.

The third modified example provides advantageous effects that are the same as the advantageous effects (a) through (d) described above of the film-forming sequence shown in FIG. 4. The deposition rate is increased the amount of chemical reaction is increased due to the lack of the residual gas removing steps.

Fourth Modified Example

Figure 8:
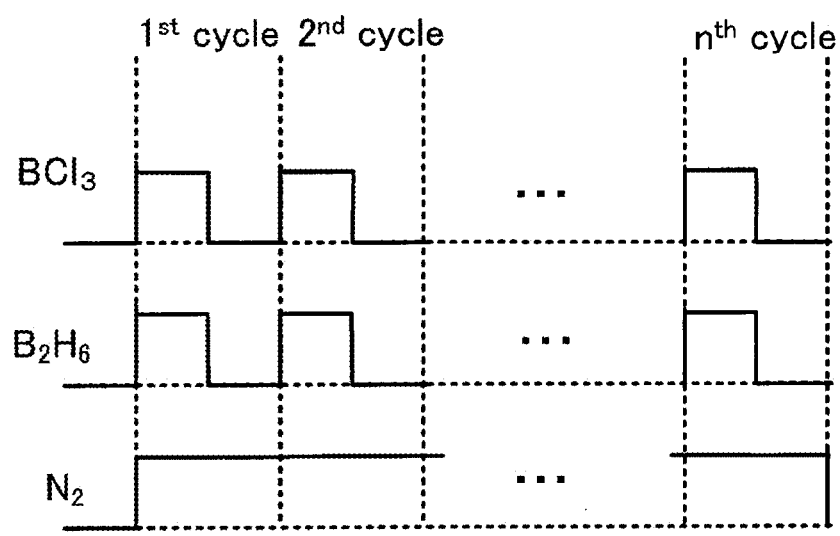
FIG. 8 illustrates a fourth modified example of the timing diagram of the gas supply according to the embodiment.

As shown in FIG. 8, a cycle including: a first step for simultaneously supplying $BCl_3$ gas and $B_2H_6$ gas; and a second step for removing residual gases may be performed a predetermined number of times (n times). Here, "simultaneously supplying $BCl_3$ gas and $B_2H_6$ gas" refers to supplying the $BCl_3$ gas and the $B_2H_6$ gas such that the $BCl_3$ gas and the $B_2H_6$ gas are simultaneously present in the process chamber 201 at one point of time. That is, the start of the supply of the $BCl_3$ gas may differ from the start of the supply of the $B_2H_6$ gas, and the stopping of the supply of the $BCl_3$ gas may differ from the stopping of the supply of the $B_2H_6$ gas The fourth modified example provides advantageous effects that are the same as the advantageous effects (a) through (d) described above of the film-forming sequence shown in FIG. 4. Since the deposition rate is increased the amount of chemical reaction is increased due to the concurrent supply of the $B_2H_6$ gas and the $BCl_3$ gas, the formation of a thick film may be facilitated.

(5) EXPERIMENT RESULTS

Experiment results supporting the advantageous effects of the above-described embodiment and examples will be described below. Experiments were performed on a boron film formed according to the sequence shown in FIG. 4 using the substrate processing apparatus 100 of the above-described embodiment. The conditions of the film-forming process are as follows.

The temperature of the heater 207: 200° C.
The inner pressure of the process chamber 201: 60 Pa
The flow rate of $BCl_3$ gas: 300 sccm
The time duration of $BCl_3$ gas supply: 5 seconds
The flow rate of $B_2H_6$ gas: 300 sccm
The time duration of $B_2H_6$ gas supply: 5 seconds
The thickness and the density of the boron film formed according to this embodiment were measured using XRR (X-ray reflectance) method. The boron film formed according to the embodiment had a thickness of 1.38 nm and a density of 1.82 $g/cm^3$.

Figure 9:
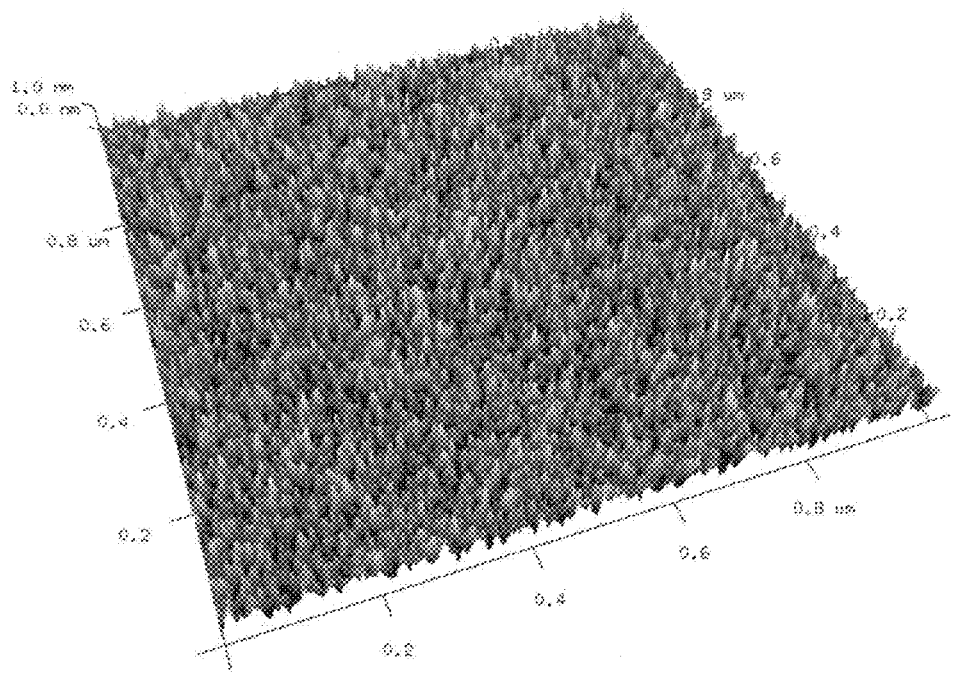
FIG. 9 illustrates an AFM (atomic-force microscopy) analysis of a film formed according to the embodiment.

The average surface roughness of the boron film formed according to the embodiment was measured using AFM (atomic force microscope). FIG. 9 depicts an AFM image of the boron film formed according to the embodiment. The root mean square surface roughness (RMS) of the boron film is 0.22 nm, and the average roughness (Ra) is 0.17 nm. Therefore, it can be confirmed that the boron film is fairly smooth.

Figure 10:
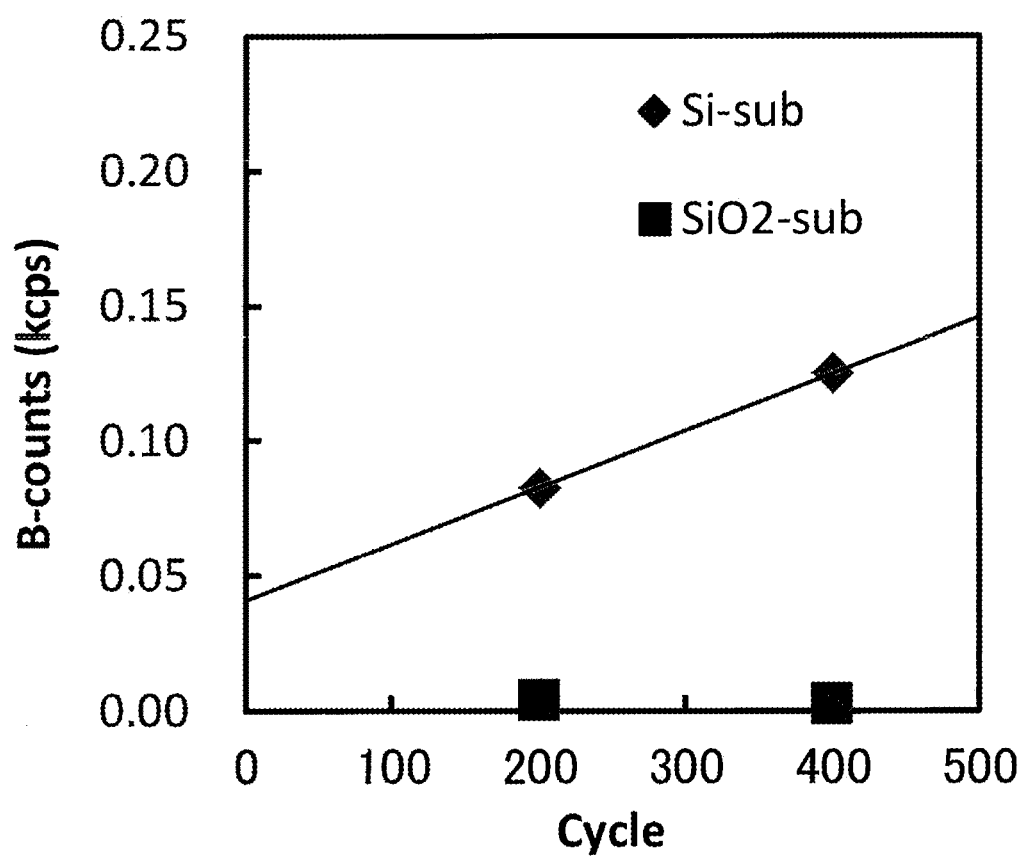
FIG. 10 illustrates an XRF (x-ray fluorescence) analysis of films formed on a silicon substrate and a silicon oxide substrate according to the embodiment.

The boron film was grown on each of a silicon substrate and a silicon oxide substrate according to the embodiment, and then the amount of boron in each of the silicon substrate and the silicon oxide substrate was measured using an x-ray fluorescence (XRF) analyzer. As shown in FIG. 10, the amount of boron on the silicon substrate increases with the number of cycles while the amount of boron on the silicon oxide substrate is constant and negligible. As shown in FIG. 10, it is confirmed that the boron film formed by the embodiment has selectivity.

Other Embodiments

The embodiments have been described in detail. However, the above-described techniques are not limited to the above-described embodiments. The techniques described herein may be variously modified without departing from the gist thereof.

While the substrate having thereon the silicon film and the silicon oxide film for selectively growing the boron film is exemplified in the above-described embodiment, the above-described technique is not limited thereto. The above-described technique may be applied to a substrate having thereon a silicon film and a SiN film. In the case, the boron film is selectively grown on the silicon film.

While boron is exemplified as a dopant element in the above-described embodiment, the above-described technique is not limited thereto. The above-described technique may be applied when elements such as phosphorus (P), arsenic (As) and indium (In) are used as the dopant element. In the case, a gas such as a phosphorus-containing gas, an arsenic-containing gas and an indium-containing gas may be used as the dopant-containing gas instead of the boron-containing gas.

While the $BCl_3$ gas and the $B_2H_6$ gas are exemplified as a dopant-containing gas in the above-described embodiment, the above-described technique is not limited thereto. The above-described technique may be applied when the combination of gases having different ligands reactive with each other to generate by-products, e.g. the combination of halogen-containing gas and hydrogen-containing reducing gas is used.

While the $BCl_3$ gas is exemplified as a dopant-containing gas containing a halogen element such as chlorine in the above-described embodiment, the above-described technique is not limited thereto. For example, halides such as pentachloride ($PCl_5$) gas, phosphorus trichloride ($PCl_3$) gas and arsenic trichloride ($AsCl_3$) may be used instead of $BCl_3$ gas.

While the $B_2H_6$ gas is exemplified as a dopant-containing gas containing hydrogen (H) its the above-described embodiment, the above-described technique is not limited thereto. For example, gases such as phosphine ($PH_3$) gas and arsine ($AsH_3$) may be used instead of $B_2H_6$ gas.

While the $N_2$ gas is exemplified as an inert gas in the above-described embodiment, the above-described technique is not limited thereto. For example, rare gases such as argon (Ar) gas, helium (He) gas, neon (Ne) gas and xenon (Xe) gas may be used instead of $N_2$ gas.

While a batch type substrate processing apparatus capable of simultaneously processing a plurality of substrates is exemplified in the above-described embodiment, the above-described technique is not limited thereto. For example, the above-described technique may be applied when a single type substrate processing apparatus capable of processing one substrate at a time is used to perform the film-forming process and the annealing process.

According to the technique described herein, a silicon substrate having a Fin structure may be uniformly doped with dopant.

What is claimed is:

1. A method of manufacturing a semiconductor device, comprising:
   (a) forming a dopant-containing film containing a dopant on a silicon film by performing a process a predetermined number of times, the process comprising: (a-1) forming a first dopant-containing film by supplying a first dopant-containing gas containing the dopant and a first ligand to a substrate having thereon the silicon film and one of a silicon oxide film and a silicon nitride film; and (a-2) forming a second dopant-containing film by supplying a second dopant-containing gas containing the dopant and a second ligand different from and reactive with the first ligand to the substrate, wherein the first dopant-containing gas comprises boron and the second dopant-containing gas comprises boron; and
   (b) forming a doped silicon film by annealing the substrate having the dopant-containing film thereon to diffuse the dopant into the silicon film,
   wherein (a-1) and (a-2) are performed simultaneously in a manner that (a-1) is performed while (a-2) is performed.

2. The method of claim 1, wherein the second ligand comprises one of a halogen element and hydrogen, and the first ligand reacts with the second ligand to generate a hydrogen halide.

3. The method of claim 1, wherein the dopant-containing film comprises a crystalline boron film.

4. The method of claim 1, wherein the first dopant-containing gas and the second dopant-containing gas comprise $BCl_3$ and $B_2H_6$, respectively, or the first dopant-containing gas and the second dopant-containing gas comprise $B_2H_6$, and $BCl_3$, respectively.

5. The method of claim 3, wherein the first dopant-containing gas comprises $BCl_3$.

6. The method of claim 3, wherein the first dopant-containing gas comprises $B_2H_6$.

7. The method of claim 1, wherein the substrate having the dopant-containing film thereon is annealed under nitrogen atmosphere in (b).

8. The method of claim 1, wherein the process further comprises: (a-3) removing the first dopant-containing gas after performing (a-1); and (a-4) removing the second dopant-containing gas after performing (a-2).

* * * * *